United States Patent
Lindhorst et al.

(10) Patent No.: US 8,122,307 B1
(45) Date of Patent: Feb. 21, 2012

(54) ONE TIME PROGRAMMABLE MEMORY TEST STRUCTURES AND METHODS

(75) Inventors: Chad A. Lindhorst, Seattle, WA (US); Todd E. Humes, Shoreline, WA (US); Andrew E. Horch, Seattle, WA (US); Ernest Allen, III, Seattle, WA (US)

(73) Assignee: Synopsys, Inc., Mountian View, CA (US)

( * ) Notice: Subject to any disclaimer, the term of this patent is extended or adjusted under 35 U.S.C. 154(b) by 691 days.

(21) Appl. No.: 11/768,974

(22) Filed: Jun. 27, 2007

Related U.S. Application Data

(60) Provisional application No. 60/837,679, filed on Aug. 15, 2006.

(51) Int. Cl.
*G11C 29/24* (2006.01)
*G11C 29/54* (2006.01)

(52) U.S. Cl. .......................... 714/719; 714/733

(58) Field of Classification Search .................. None
See application file for complete search history.

(56) References Cited

U.S. PATENT DOCUMENTS

| | | |
|---|---|---|
| 4,158,239 A | 6/1979 | Bertin |
| 4,384,288 A | 5/1983 | Walton |
| 4,388,524 A | 6/1983 | Walton |
| 4,541,073 A | 9/1985 | Brice et al. |
| 4,546,241 A | 10/1985 | Walton |
| 4,571,704 A | 2/1986 | Bohac, Jr. |
| 4,580,041 A | 4/1986 | Walton |
| 4,758,869 A | 7/1988 | Eitan et al. |
| 4,935,702 A | 6/1990 | Mead et al. |
| 4,953,928 A | 9/1990 | Anderson et al. |
| 5,018,102 A | 5/1991 | Houston |
| 5,068,622 A | 11/1991 | Mead et al. |
| 5,086,331 A | 2/1992 | Hartgring et al. |
| 5,124,568 A | 6/1992 | Chen et al. |
| 5,146,106 A | 9/1992 | Anderson et al. |
| 5,272,368 A | 12/1993 | Turner et al. |
| 5,301,150 A | 4/1994 | Sullivan et al. |
| 5,323,066 A | 6/1994 | Feddeler et al. |
| 5,361,001 A | 11/1994 | Stolfa |
| 5,384,727 A | 1/1995 | Moyal et al. |

(Continued)

FOREIGN PATENT DOCUMENTS

EP    0326883 A2    8/1989

(Continued)

OTHER PUBLICATIONS

Chang, C.Y. et al., "ULSI Devices", John Wiley & Sons, pp. 119-124, 2000.

(Continued)

*Primary Examiner* — Jeffrey A Gaffin
*Assistant Examiner* — Dipakkumar Gandhi
(74) *Attorney, Agent, or Firm* — Fenwick & West LLP

(57) ABSTRACT

One Time Programmable (OTP) memory structures and methods for pretesting the support circuitry are provided. A group of dedicated test cells associated with one or more groups of regular OTP cells are used to test the support circuitry for the regular OTP cells. The dedicated cells are programmed and read. The read values are compared to the programmed values or expected values. As a result of the comparison, failing memories may be designated "Not Usable", while regular OTP cells of passing memories can be programmed for their purpose resulting in elimination of wasted memories during test.

49 Claims, 13 Drawing Sheets

DEVICE WITH MEMORY

U.S. PATENT DOCUMENTS

| | | |
|---|---|---|
| 5,394,367 A | 2/1995 | Downs et al. |
| 5,412,594 A | 5/1995 | Moyal et al. |
| 5,430,670 A | 7/1995 | Rosenthal |
| 5,438,542 A | 8/1995 | Atsumi et al. |
| 5,463,348 A | 10/1995 | Sarpeshkar et al. |
| 5,504,707 A | 4/1996 | Koizumi |
| 5,517,044 A | 5/1996 | Koyama |
| 5,541,878 A | 7/1996 | LeMoncheck et al. |
| 5,596,524 A | 1/1997 | Lin et al. |
| 5,598,369 A | 1/1997 | Chen et al. |
| 5,616,942 A | 4/1997 | Song |
| 5,617,358 A | 4/1997 | Kodama |
| 5,623,442 A | 4/1997 | Gotou et al. |
| 5,627,392 A | 5/1997 | Diorio |
| 5,633,518 A | 5/1997 | Broze |
| 5,650,966 A | 7/1997 | Cleveland et al. |
| 5,657,271 A | 8/1997 | Mori |
| 5,659,498 A | 8/1997 | Pascucci et al. |
| 5,666,307 A | 9/1997 | Chang |
| 5,677,917 A | 10/1997 | Wheelus et al. |
| 5,687,118 A | 11/1997 | Chang |
| 5,691,939 A | 11/1997 | Chang et al. |
| 5,706,227 A | 1/1998 | Chang et al. |
| 5,717,636 A | 2/1998 | Dallabora et al. |
| 5,729,155 A | 3/1998 | Kobatake |
| 5,731,716 A | 3/1998 | Pascucci |
| 5,736,764 A | 4/1998 | Chang |
| 5,754,471 A | 5/1998 | Peng et al. |
| 5,761,121 A | 6/1998 | Chang |
| 5,763,912 A | 6/1998 | Parat et al. |
| 5,777,361 A | 7/1998 | Parris et al. |
| 5,777,926 A | 7/1998 | Trinh et al. |
| 5,784,327 A * | 7/1998 | Hazani .................... 365/189.03 |
| 5,786,617 A | 7/1998 | Merrill et al. |
| 5,790,060 A | 8/1998 | Tesch |
| 5,796,656 A | 8/1998 | Kowshik et al. |
| 5,798,967 A | 8/1998 | Sarin et al. |
| 5,801,994 A | 9/1998 | Chang et al. |
| 5,822,714 A | 10/1998 | Cato |
| 5,825,063 A | 10/1998 | Diorio et al. |
| 5,835,402 A | 11/1998 | Rao et al. |
| 5,841,165 A | 11/1998 | Chang et al. |
| 5,844,300 A | 12/1998 | Alavi et al. |
| 5,854,762 A | 12/1998 | Pascucci |
| 5,875,126 A | 2/1999 | Minch et al. |
| 5,886,566 A | 3/1999 | Park et al. |
| 5,890,199 A | 3/1999 | Downs |
| 5,892,709 A | 4/1999 | Parris et al. |
| 5,892,712 A | 4/1999 | Hirose et al. |
| 5,898,613 A | 4/1999 | Diorio et al. |
| 5,901,084 A | 5/1999 | Ohnakado |
| 5,912,841 A | 6/1999 | Kim |
| 5,912,842 A | 6/1999 | Chang et al. |
| 5,912,937 A | 6/1999 | Goetting et al. |
| 5,914,894 A | 6/1999 | Diorio et al. |
| 5,939,945 A | 8/1999 | Thewes et al. |
| 5,966,329 A | 10/1999 | Hsu et al. |
| 5,969,987 A | 10/1999 | Blyth et al. |
| 5,972,804 A | 10/1999 | Tobin et al. |
| 5,982,669 A | 11/1999 | Kalnitsky et al. |
| 5,986,927 A | 11/1999 | Minch et al. |
| 5,990,512 A | 11/1999 | Diorio et al. |
| 6,011,425 A | 1/2000 | Oh et al. |
| 6,028,789 A | 2/2000 | Mehta et al. |
| 6,041,000 A | 3/2000 | McClure et al. |
| 6,049,229 A | 4/2000 | Manohar et al. |
| 6,055,185 A | 4/2000 | Kalnitsky et al. |
| 6,060,919 A | 5/2000 | Wilson et al. |
| 6,081,451 A | 6/2000 | Kalnitsky et al. |
| 6,111,785 A | 8/2000 | Hirano |
| 6,125,053 A | 9/2000 | Diorio et al. |
| 6,137,721 A | 10/2000 | Kalnitsky et al. |
| 6,137,722 A | 10/2000 | Kalnitsky et al. |
| 6,137,723 A | 10/2000 | Bergemont et al. |
| 6,137,724 A | 10/2000 | Kalnitsky et al. |
| 6,141,247 A | 10/2000 | Roohparvar et al. |
| 6,143,607 A | 11/2000 | Chi |
| 6,144,581 A | 11/2000 | Diorio et al. |
| 6,151,238 A | 11/2000 | Smit et al. |
| 6,166,954 A | 12/2000 | Chern |
| 6,166,978 A | 12/2000 | Goto |
| 6,181,601 B1 | 1/2001 | Chi |
| 6,190,968 B1 | 2/2001 | Kalnitsky et al. |
| 6,208,557 B1 | 3/2001 | Bergemont et al. |
| 6,214,666 B1 | 4/2001 | Mehta |
| 6,222,765 B1 | 4/2001 | Nojima |
| 6,222,771 B1 | 4/2001 | Tang et al. |
| 6,236,223 B1 | 5/2001 | Brady et al. |
| 6,294,427 B1 | 9/2001 | Furuhata et al. |
| 6,294,810 B1 | 9/2001 | Li et al. |
| 6,294,997 B1 | 9/2001 | Paratore et al. |
| 6,320,788 B1 | 11/2001 | Sansbury et al. |
| 6,331,949 B1 | 12/2001 | Hirano |
| 6,363,006 B2 | 3/2002 | Naffziger et al. |
| 6,363,011 B1 | 3/2002 | Hirose et al. |
| 6,373,771 B1 | 4/2002 | Fifield et al. |
| 6,384,451 B1 | 5/2002 | Caywood |
| 6,385,000 B1 | 5/2002 | Ottesen et al. |
| 6,385,090 B1 | 5/2002 | Kitazaki |
| 6,400,622 B1 | 6/2002 | Fujiwara |
| 6,407,953 B1 * | 6/2002 | Cleeves .................... 365/201 |
| 6,411,545 B1 | 6/2002 | Caywood |
| 6,442,074 B1 | 8/2002 | Hamilton et al. |
| 6,452,835 B1 | 9/2002 | Diorio et al. |
| 6,456,992 B1 | 9/2002 | Shibata et al. |
| 6,469,930 B1 | 10/2002 | Murray |
| 6,469,937 B2 | 10/2002 | Fuchigami et al. |
| 6,477,103 B1 | 11/2002 | Nguyen et al. |
| 6,477,672 B1 * | 11/2002 | Satoh ........................ 714/721 |
| 6,479,863 B2 | 11/2002 | Caywood |
| 6,510,086 B2 | 1/2003 | Kato et al. |
| 6,515,919 B1 | 2/2003 | Lee |
| 6,529,407 B2 | 3/2003 | Shukuri |
| 6,534,816 B1 | 3/2003 | Caywood |
| 6,538,468 B1 | 3/2003 | Moore |
| 6,563,731 B1 | 5/2003 | Bergemont |
| 6,573,765 B2 | 6/2003 | Bales et al. |
| 6,590,825 B2 | 7/2003 | Tran et al. |
| 6,611,463 B1 | 8/2003 | Mehta et al. |
| 6,633,188 B1 | 10/2003 | Jia et al. |
| 6,641,050 B2 | 11/2003 | Kelley et al. |
| 6,646,919 B1 | 11/2003 | Madurawe et al. |
| 6,654,272 B2 | 11/2003 | Santin et al. |
| 6,661,278 B1 | 12/2003 | Gilliland |
| 6,664,909 B1 | 12/2003 | Hyde et al. |
| 6,678,190 B2 | 1/2004 | Yang et al. |
| 6,693,819 B2 | 2/2004 | Smith et al. |
| 6,724,657 B2 | 4/2004 | Shukuri |
| 6,741,500 B2 | 5/2004 | DeShazo et al. |
| 6,781,881 B2 | 8/2004 | Chih |
| 6,822,894 B1 | 11/2004 | Costello et al. |
| 6,845,029 B2 | 1/2005 | Santin et al. |
| 6,853,583 B2 | 2/2005 | Diorio et al. |
| 6,898,123 B2 | 5/2005 | Owen |
| 6,903,436 B2 | 6/2005 | Luo et al. |
| 6,909,389 B1 | 6/2005 | Hyde et al. |
| 6,946,892 B2 | 9/2005 | Mitarashi |
| 6,950,342 B2 | 9/2005 | Lindhorst et al. |
| 7,046,549 B2 | 5/2006 | Lee et al. |
| 7,106,642 B2 | 9/2006 | Hojo |
| 7,177,182 B2 | 2/2007 | Diorio et al. |
| 7,221,596 B2 | 5/2007 | Pesavento et al. |
| 7,283,390 B2 | 10/2007 | Pesavento |
| 7,307,534 B2 | 12/2007 | Pesavento |
| 7,388,420 B2 | 6/2008 | Diorio et al. |
| 7,474,568 B2 | 1/2009 | Horch |
| 7,486,537 B2 * | 2/2009 | Scheuerlein et al. ......... 365/148 |
| 7,508,719 B2 | 3/2009 | Horch |
| 7,573,749 B2 | 8/2009 | Diorio et al. |
| 2001/0035216 A1 | 11/2001 | Kyle |
| 2001/0035816 A1 | 11/2001 | Beigel et al. |
| 2002/0008271 A1 | 1/2002 | Hsu et al. |
| 2002/0020871 A1 | 2/2002 | Forbes |
| 2002/0027233 A1 | 3/2002 | Yamaki et al. |
| 2002/0122331 A1 | 9/2002 | Santin et al. |
| 2002/0159298 A1 | 10/2002 | Hirano |
| 2003/0123276 A1 | 7/2003 | Yokozeki |

| | | | |
|---|---|---|---|
| 2003/0183871 A1 | 10/2003 | Dugger et al. | |
| 2003/0206437 A1 | 11/2003 | Diorio et al. | |
| 2003/0218925 A1 | 11/2003 | Torjussen et al. | |
| 2004/0004861 A1 | 1/2004 | Srinivas et al. | |
| 2004/0017295 A1 | 1/2004 | Dishongh et al. | |
| 2004/0021166 A1 | 2/2004 | Hyde et al. | |
| 2004/0021170 A1 | 2/2004 | Caywood | |
| 2004/0037127 A1 | 2/2004 | Lindhorst et al. | |
| 2004/0052113 A1 | 3/2004 | Diorio et al. | |
| 2004/0080982 A1 | 4/2004 | Roizin | |
| 2004/0136245 A1 | 7/2004 | Makamura et al. | |
| 2004/0195593 A1 | 10/2004 | Diorio et al. | |
| 2004/0206999 A1 | 10/2004 | Hyde et al. | |
| 2004/0263319 A1 | 12/2004 | Huomo | |
| 2005/0063235 A1* | 3/2005 | Pesavento et al. | 365/222 |
| 2005/0105331 A1* | 5/2005 | Lee et al. | 365/185.11 |
| 2005/0149896 A1 | 7/2005 | Madurawe | |
| 2005/0219931 A1 | 10/2005 | Diorio et al. | |
| 2005/0251617 A1 | 11/2005 | Sinclair et al. | |
| 2006/0123186 A1 | 6/2006 | Loh et al. | |
| 2006/0133140 A1 | 6/2006 | Gutnik et al. | |
| 2006/0133175 A1 | 6/2006 | Gutnik et al. | |
| 2006/0221715 A1 | 10/2006 | Ma et al. | |
| 2007/0140023 A1* | 6/2007 | Helfer et al. | 365/200 |
| 2007/0263456 A1 | 11/2007 | Wang et al. | |
| 2008/0007284 A1* | 1/2008 | Balog | 324/765 |
| 2008/0023790 A1* | 1/2008 | Scheuerlein | 257/530 |
| 2008/0049519 A1 | 2/2008 | Horch | |
| 2008/0056010 A1 | 3/2008 | Horch | |
| 2008/0112238 A1 | 5/2008 | Kim et al. | |
| 2008/0205150 A1 | 8/2008 | Pesavento | |
| 2008/0279013 A1 | 11/2008 | Horch et al. | |

FOREIGN PATENT DOCUMENTS

| | | | |
|---|---|---|---|
| EP | 0336500 B1 | 10/1989 | |
| EP | 0298618 A2 | 10/1993 | |
| EP | 0756379 B1 | 1/1997 | |
| EP | 0776049 B1 | 8/2000 | |
| EP | 0778623 B1 | 7/2001 | |
| EP | 1327993 A1 | 7/2003 | |
| WO | WO 2005/106893 A1 | 11/2005 | |
| WO | WO 2005109516 A1 * | 11/2005 | |

OTHER PUBLICATIONS

Chen, Ih-Chin et al., "A Quantitative Physical Model for the Band-to-Band Tunneling-Induced Substrate Hot Electron Injection in MOS Devices", IEEE Transactions on Electron Devices, vol. 39, No. 7, pp. 1646-1651, Jul. 1992.

Figueroa, Miguel et al., "A Mixed-Signal Approach to High-Performance Low-Power Linear Filters", IEEE Journal of Solid State Circuits, vol. 36, No. 5, pp. 816-822, May 2001.

Hyde, John et al., "A floating-gate trimmed, 14-bit, 250 Ms/s digital-to-analog converter in standard 0.25 µm CMOS", Symposium on VLSI Circuits Digest of Technical Papers, pp. 328-331, 2002.

Office Action for U.S. Appl. No. 11/601,305 mailed May 22, 2008.

Response to Office Action for U.S. Appl. No. 11/601,305, filed Sep. 22, 2008.

Office Action for U.S. Appl. No. 11/601,474 mailed Dec. 28, 2007.

Response to Office Action for U.S. Appl. No. 11/601,474, filed Mar. 28, 2008.

Carley, L. Richard, Trimming Analog Circuits Using Floating-Gate Analog MOS Memory, IEEE Journal of Solid-State Circuits, vol. 24, No. 6, Dec. 1989, pp. 1569-1575.

Chang, L. et al., "Non-Volatile Memory Device With True CMOS Compatibility", Electronics Letters, vol. 35, No. 17, Aug. 19, 1999,pp. 1443-1445.

Chang, Leland et al., "A CMOS-Compatible Single-Poly Cell for Use As Non-Volatile Memory", International Semiconductor Device Research Symposium, Dec. 1-3, 1999, pp. 57-60.

Chung, S.S. et al., "N-Channel Versus P-Channel Flash EEPROM-Which One Has Better Reliabilities", 39th Annual IEEE International Reliability Physics Symposium, 2001, pp. 67-72.

Declercq M. et al., "Design and Optimization of High-Voltage CMOS Devices Compatible with a Standard 5 V CMOS Technology", IEEE Custom Integrated Circuits Conference, 1993, pp. 24.6.1-24.6.4.

Dickson, John F., "On-Chip High-Voltage Generation in MNOS Integrated Circuits Using an Improved Voltage Multiplier Technique", IEEE Journal of Solid-State Circuits, vol. SC-11, No. 3, Jun. 1976, pp. 374-378.

Diorio, C. et al., "A High-Resolution Non-Volatile Analog Memory Cell", IEEE International Symposium on Circuits and Systems, vol. 3, 1995, pp. 2233-2236.

Diorio, C. et al., "A Floating-Gate MOS Learning Array with Locally Computed Weight Updates" IEEE Transactions on Electron Devices, vol. 44, No. 12, Dec. 1997, pp. 1-10.

Diorio, C., "A p-Channel MOS Synapse Transistor with Self-Convergent Memory Writes", IEEE Transaction on Electron Devices, vol. 47, No. 2, Feb. 2000, pp. 464-472.

European Examination Report, European Application No. 05733121.7, May 9, 2008, 6 pages.

European Supplementary Search Report, European Application No. 05733121.7, Sep. 14, 2007, 4 pages.

European Examination Report, European Application No. 03763311.2, May 18, 2005, 4 pages.

European Examination Report, European Application No. 03763311.2, Feb. 7, 2006, 3 pages.

European Examination Report, European Application No. 03763311.2, Jun. 26, 2006, 4 pages.

Herdt, C. et al., "Analysis, Measurement, and Simulation of Dynamic Write Inhibit in an nvSRAM Cell", IEEE Transactions on Electron Devices, vol. 39, No. 5, May 1992, pp. 1191-1196.

IBM Technical Disclosure Bulletin, "Fuse Circuit With Zero DC Current", IBM Corporation, Jul. 1987, vol. 30, No. 2.

International Search Report for International Application No. PCT/US03/23724, mailed Jan. 20, 2004.

Invitation to Pay Additional Fees for Application No. PCT/US03/31792, mailed Apr. 2, 2004.

International Search Report for International Application No. PCT/US03/31792, mailed Aug. 12, 2004.

International Search Report and Written Opinion for International Application No. PCT/US2005/013644, mailed Aug. 3, 2005.

International Search Report for International Application No. PCT/US2005/010431, mailed Sep. 27, 2005.

International Preliminary Report on Patentability for International Application No. PCT/US05/10432, mailed Jun. 19, 2006.

International Search Report and Written Opinion for International Application No. PCT/US05/10432, mailed Sep. 27, 2005.

International Search Report and Written Opinion for International Application No. PCT/US05/10434, mailed Sep. 13, 2005.

International Preliminary Report on Patentability for International Application No. PCT/US05/10434, Mar. 9, 2006.

Invitation to Pay Additional Fees for Application No. PCT/US2005/015606, mailed Nov. 18, 2005.

International Search Report and Written Opinion for International Application PCT/US2005/015606, mailed Feb. 24, 2006.

Lanzoni M. et al., "A Novel Approach to Controlled Programming of Tunnel-Based Floating-Gate MOSFETs", 1994 IEEE Journal of Solid-State Circuits, vol. 29, No. 2, pp. 147-150.

Office Action for U.S. Appl. No. 11/015,293, mailed Apr. 4, 2007.

Ohsaki K., et al., "A Single Poly EEPROM Cell Structure for Use in Standard CMOS Processes", IEEE Journal of Solid-State Circuits, vol. 29, No. 3, Mar. 1994, pp. 311-316.

Raszka, J. et al., "Embedded Flash Memory for Security Applications in a 0.13 IJm CMOS Logic Process", 2004 IEEE International Solid-State Circuits Conference, ISSCC, Session 2, Non-Volatile Memory, 2.4, pp. 46-47, Feb. 2004.

Shi, Y. et al., "Polarity Dependent Gate Tunneling Currents in Dual-Gate CMOSFET's", IEEE Transactions on Electron Devices, vol. 45, No. 11, Nov. 1998, pp. 2355-2360.

United States Office Action, U.S. Appl. No. 11/237,099, Mar. 9, 2007, 15 pages.

United States Office Action, U.S. Appl. No. 11/237,099, Oct. 2, 2006, 14 pages.

United States Office Action, U.S. Appl. No. 11/829,370, Sep. 2, 2010, 11 pages.

United States Office Action, U.S. Appl. No. 11/829,370, Apr. 1, 2010, 15 pages.

United States Office Action, U.S. Appl. No. 11/829,370, Sep. 25, 2009, 22 pages.

United States Office Action, U.S. Appl. No. 11/829,370, Feb. 10, 2009, 12 pages.

Usuki, T. et al., "Direct Tunneling Memory: Trade-off BetvYeen Nonvolatility and High-Endurance with Low Voltage Operations", Nonvolatile Semiconductor Workshop Symposium, Aug. 12, 2001, pp. 80-81.

Vittoz, E., "Dynamic Analog Techniques", Design of Analog-Digital VLSI Circuits for Telecommunications and Signal ProceSSing, Second Edition, Chapter 4, 1994, pp. 97-124.

Witters J.S., et al., "Analysis and Modeling of On-Chip High-Voltage Generator Circuits for Use in EEPROM Circuits", IEEE Journal of Solid-State Circuits, vol. 24, No. 5, Oct. 1989, pp. 1372-1380.

* cited by examiner

*DEVICE WITH HYBRID MEMORY*

*PROGRAMMING AND TESTING OF OTP MEMORY*

DEVICE WITH REGULAR OTP MEMORY CELLS AND PRETESTED SUPPORT CIRCUITRY

PROGRAMMED NVM DEVICE WITH PRETESTED SUPPORT CIRCUITRY

PRETESTING OF OTP MEMORY PRIOR TO PROGRAMMING

*DEDICATED TEST CELL CONFIGURATIONS*

ONE TIME PROGRAMMABLE MEMORY TEST STRUCTURES AND METHODS

RELATED APPLICATIONS

This utility patent application claims the benefit of U.S. Provisional Application Ser. No. 60/837,679 filed on Aug. 15, 2006, which is hereby claimed under 35 U.S.C. §119(e). The provisional application is incorporated herein by reference.

BACKGROUND

Memory devices are electronic devices arranged to store electrical signals. For example, a basic memory element may be a fuse that can either be open or be closed. Open and closed states of the fuse may be used to designate one bit of information corresponding to a value of 1 or 0. A plurality of memory elements can be combined in various arrangements in order to store multiple bits arranged in words or other combinations. Various electronic circuits including semiconductor devices such as transistors are used as memory elements.

Memory elements may be classified in two main categories: volatile and nonvolatile. Volatile memory loses any data as soon as the system is turned off. Thus, it requires constant power to remain viable. Most types of random access memory (RAM) fall into this category. Non-volatile memory does not lose its data when the system or device is turned off. An NVM device may be implemented as a MOS transistor that has a source, a drain, an access or a control gate, and a floating gate. It is structurally different from a standard MOSFET in its floating gate, which is electrically isolated, or "floating".

A range of considerations including a purpose of the device, power consumption, size, retention capacity and duration may influence design of non-volatile memory devices. For example, some NVM devices may be categorized as floating gate or charge-trapping from a programming perspective.

Non-volatile memory devices may also be implemented as NVM arrays that include a plurality of NVM cells arranged in rows and columns. In general, single-transistor n-channel NVM cells operate as follows. During an erase operation, electrons are removed from a floating gate of the NVM cell, thereby lowering the threshold voltage of the NVM cell. During a program operation, electrons are inserted into the floating gate of the NVM cell, thereby raising the threshold voltage of the NVM cell. Thus, during program and erase operations, the threshold voltages of selected NVM cells are changed. During a read operation, read voltages are applied to selected NVM cells. In response, read currents flow through these selected NVM cells.

An important part of memory manufacturing process is testing the manufactured memory devices. For multiple times programmable devices, the memories may be programmed with test values, then read, and their usability confirmed. Since the devices are multiple times programmable, the tested devices may then be returned to the manufactured batch.

On the other hand, testing one time programmable memories presents a number of challenges. 100% testing is impossible, since any memory programmed for testing becomes unusable for other purposes. Sample testing brings in statistical risk factors as well as a wasted group of memories for each tested batch.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Embodiments are directed to only One Time Programmable (OTP) memory structures and methods of testing those. One or more dedicated memory test cells may be utilized for testing support circuitry associated with a group of regular OTP memory cells. The dedicated memory test cells may be an extra group of cells in an array, randomly selected cells among the regular OTP cells, and the like. During a pretest process, the dedicated test cells are programmed and read. The read values are then compared to the programmed or expected values enabling a determination whether the support circuitry for the associated regular OTP memory cells are usable or not.

This and other features and advantages of the invention will be better understood in view of the Detailed Description and the Drawings, in which:

BRIEF DESCRIPTION OF THE DRAWINGS

Non-limiting and non-exhaustive embodiments are described with reference to the following drawings.

DETAILED DESCRIPTION

Figure 1:
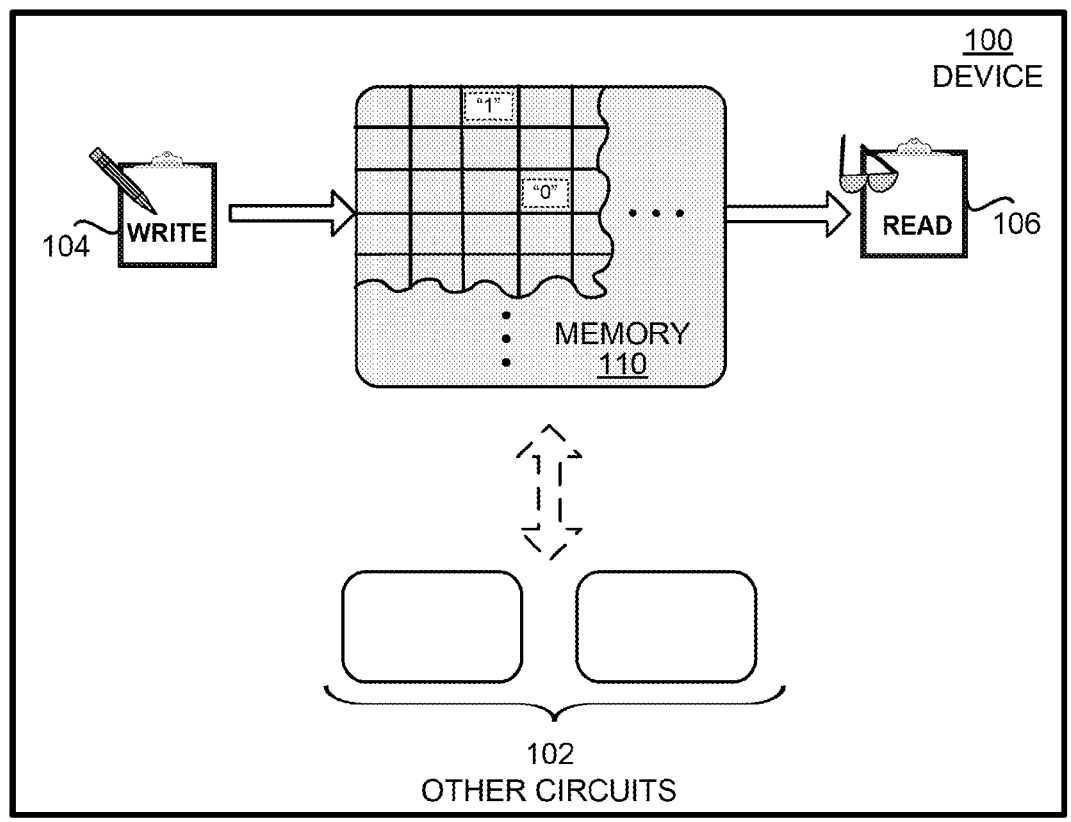
FIG. 1 is a diagram of an electronic device that includes a memory storing information to be used by other circuits.

Various embodiments will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed subject matter.

Throughout the specification and claims, the following terms take at least the meanings explicitly associated herein, unless the context clearly dictates otherwise. The meanings identified below are not intended to limit the terms, but merely provide illustrative examples for the terms. The meaning of "a," "an," and "the" includes plural reference, the meaning of "in" includes "in" and "on." The term "connected" means a direct electrical connection between the items connected, without any intermediate devices. The term "coupled" means either a direct electrical connection between the items connected or an indirect connection through one or more passive or active intermediary devices. The term "circuit" means either a single component or a multiplicity of components, either active and/or passive, that are coupled together to provide a desired function. The term "signal" means at least one current, voltage, charge, temperature, data, or other measurable quantity.

All of the circuits described in this document may be implemented as circuits in the traditional sense, such as with integrated circuits and the like. All or some of them can also be implemented equivalently by other ways known in the art, such as by using one or more processors, Digital Signal Processing (DSP), a Floating Point Gate Array (FPGA), a general purpose micro processor and the like.

FIG. 1 is a diagram of an electronic device that includes a memory storing information to be used by other circuits.

Device 100 includes memory 110 that is adapted to interact with other circuits 102. Individual cells of memory 110 are adapted to store information as a result of "write" operation 104 and provide the stored information as a result of "read" operation 106. The information is stored even during a power-off state of device 100.

"Read" operation 106, which provides the stored information to one or more of the other circuits 102, may occur during a transition from the power-off state to a power-on state for some parts of memory 110. For other parts of memory 110, "read" operation 106 may occur during the power-on state upon being addressed by another circuit (e.g. a controller).

As a result, different circuits of device 100 may receive data for their operation at different states of powering the device. For example, an oscillator circuit may be provided calibration data during the transition from the power-off state from one part of memory 110, while a digital signal processor circuit may be provided programming data after the transition.

The information stored in memory 110 may include analog, digital or other types of data. For example, different parts of memory 110 may provide logic bits, ON/OFF states, latched outputs for trimming analog circuits, and the like.

Figure 2A:
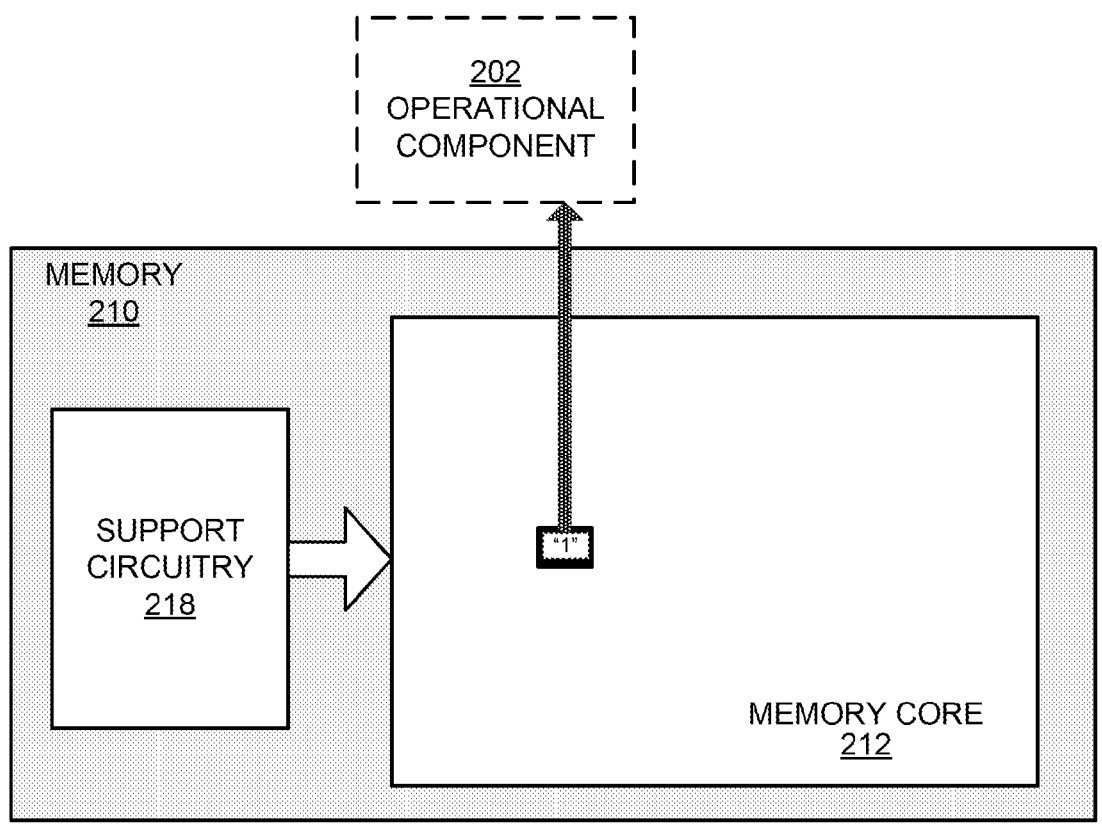
FIG. 2A is a block diagram of one type of memory comprising a homogeneous memory core and associated support circuitry.

FIG. 2A is a block diagram of one type of memory comprising a homogeneous memory core and associated support circuitry.

Memory 210 may include memory core 212 for storing information and support circuitry 218 for operations associated with the memory core 212. Operational component 202 may be one of the other circuits 102 of FIG. 1 and be part of the same device with memory 210 or in a separate device.

Memory core 212 may be an ordinary NVM circuit that is arranged to store data ("1"), a logic or non-logic value, such as an ON/OFF state, in individual cells and provide the data upon being addressed. In one embodiment, memory core may be in an array form comprising cells that are addressable in terms of a row and a column.

In some embodiments, a value for the data may be encoded in an amount of charge stored in a device. In another embodiment, the data may be at least one logical bit, such as a 1 or a zero, stored in a cell. Of course, the data may need more than one cell, and so on.

As mentioned above, support circuitry 218 is for performing operations associated with memory core 212. These operations may include, but are not limited to, providing supply voltage, providing programming voltage, selecting a cell for programming or reading, reading a cell, testing a cell, and the like. In addition, support circuitry 218 may cooperate with other components, such as operational component 202.

Operational component 202 may be adapted to receive the data for processing, calibration, and the like. In FIG. 2A, the data is input in operational component 202 directly. In other embodiments, the data may be routed through any suitable component before being input in operational component 202. For example, the data may be first input from a cell into a binary output circuit. Then, from the binary output circuit, the data may be input in operational component 202.

Memory 210 may be implemented with fewer or additional components such as communication circuitry for interaction with other devices.

Figure 2B:
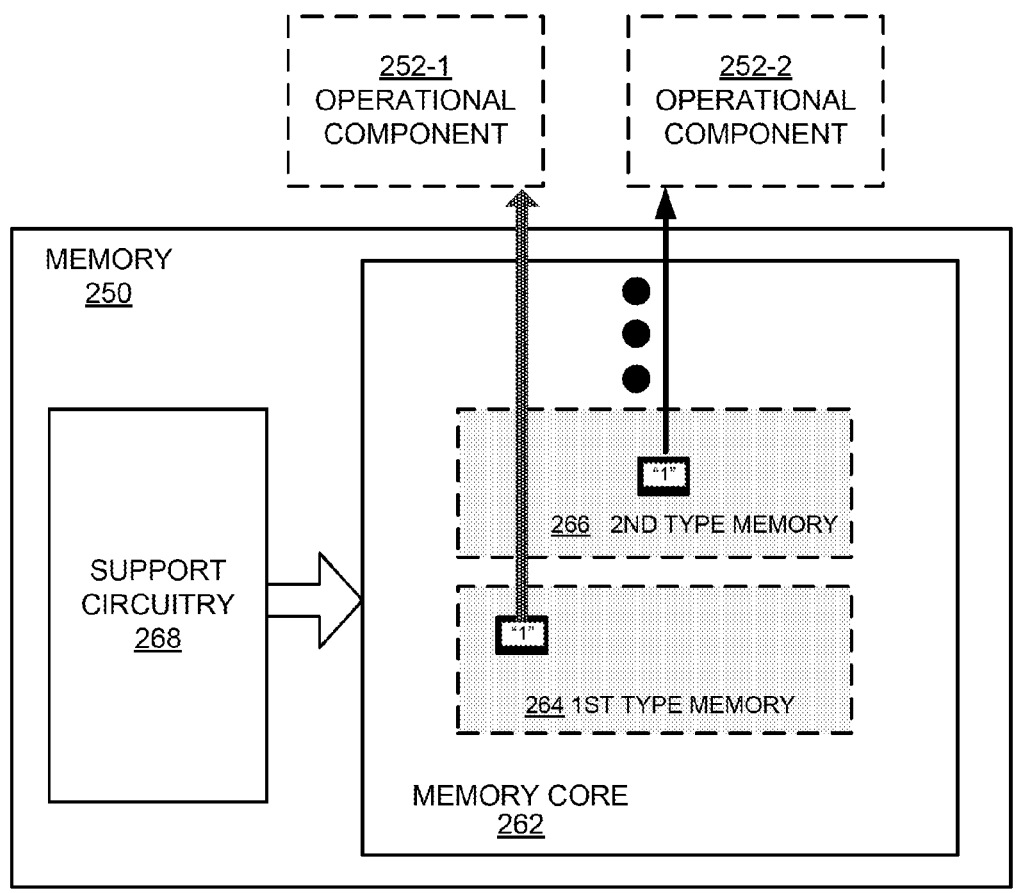
FIG. 2B is a block diagram of another type of memory comprising a hybrid memory core and associated support circuitry.

FIG. 2B is a block diagram of another type of memory comprising a hybrid memory core and associated support circuitry.

The memory core 262 of memory 250 includes first type memory 264 and second type memory 266. First type memory 264 and second type memory 266 may include any type of memory circuits such as One Time Programmable (OTP), Multiple Times Programmable (MTP), transistor based memory circuits, fuse-based memory circuits, different formations of arrays, and the like. Each type may be used for a different purpose of operational component (e.g. operational components 252-1 and 252-2).

For example, first type memory 264 may provide a fast output for calibrating operational component 252-1 during a transition to the power-on state, while second type memory 266 may provide programming data to operational component 252-2 in the power-on state upon being addressed by support circuitry 268.

Support circuitry 268 is adapted to interact with both types of memories. The interaction may include programming the memories, addressing individual cells to output their data, and the like.

By integrating first type memory 264 and second type memory 266, and combining at least a portion of the support operations in a single support circuitry, size and power consumption can be optimized.

Figure 3A:
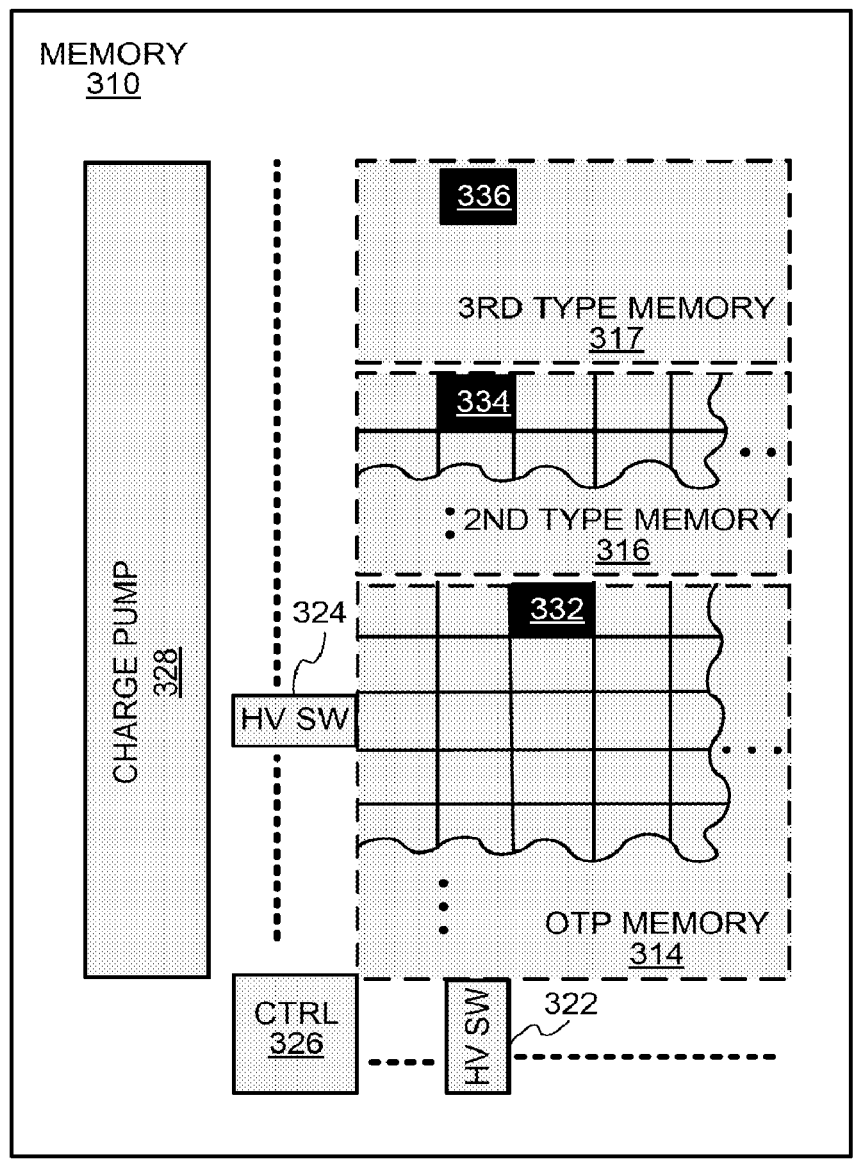
FIG. 3A is a detailed block diagram of a hybrid memory including an only One-Time Programmable (OTP) portion and example support circuits.

FIG. 3A is a detailed block diagram of a hybrid memory including a One-Time Programmable (OTP) portion and example support circuits.

The memory core of memory 310 includes first type memory 314, which is an OTP memory, second type memory 316, and third type memory 317. These memories are examples of different memory types as described in conjunction with previous figures.

Memory circuits commonly comprise a number of cells (e.g. cells 332, 334, and 336), which store the data to be consumed by operational components. Memory circuits may be implemented in form of a memory array (e.g. an NVM array) comprising cells that are addressable in terms of a row and a column. First type memory 314 and second type memory 316 are examples of NVM arrays, while third type memory 317 illustrates a non-array NVM circuit.

Figure 3B:
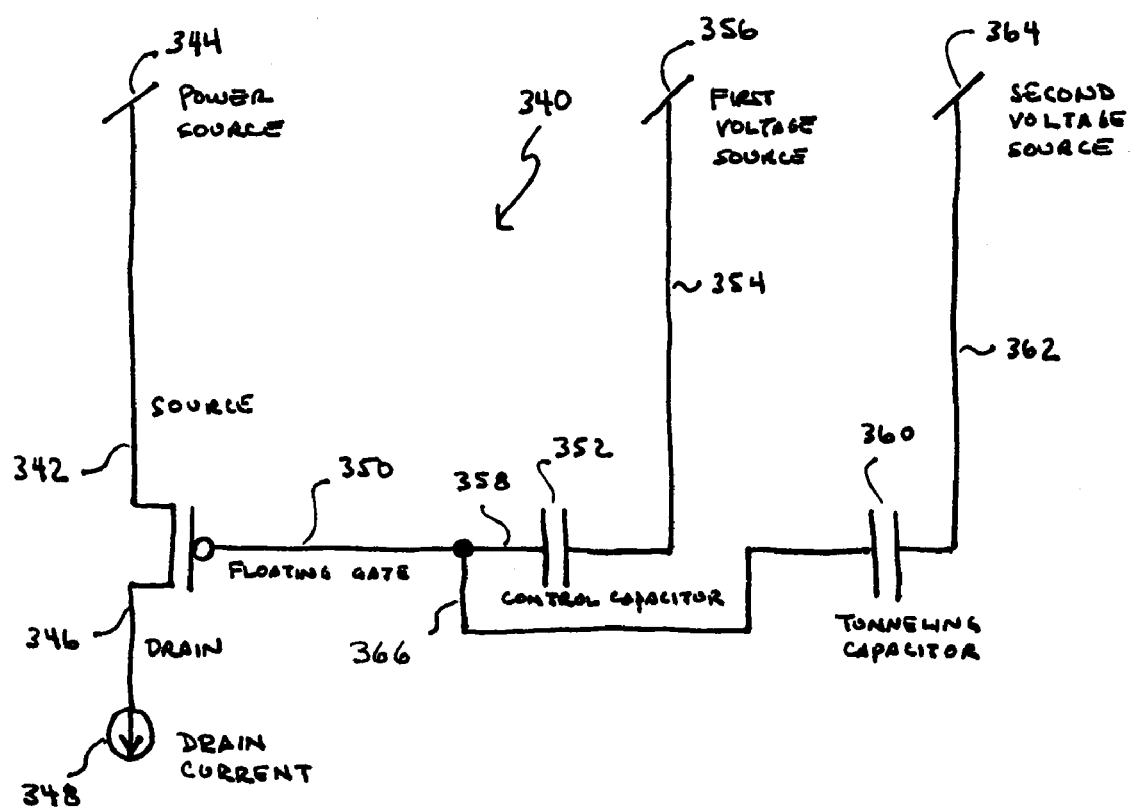
FIG. 3B is an electrical schematic diagram of a memory cell in accordance with one embodiment.

In some embodiments (as illustrated, for example, in FIG. 3B), a non-volatile memory cell may be constructed using a floating-gate pFET readout transistor 340 having its source 342 tied to a power source 344 and its drain 346 providing a current 348, which can be sensed to determine the state of the cell 340. The gate 350 of the pFET readout transistor 340 provides for charge storage, which can be used to represent information such as binary bits. A control capacitor structure 352 having its first terminal 354 coupled to a first voltage source 356 and its second terminal 358 coupled to the floating gate 350 and a tunneling capacitor structure 360 having its first terminal 362 coupled to a second voltage source 364 and its second terminal 366 coupled to the floating gate 350 may be utilized in each embodiment.

The control capacitor structure 352 is fabricated so that it has much more capacitance than does the tunneling capacitor structure 360 (and assorted stray capacitance between the floating gate 350 and various other nodes of the cell 340). Manipulation of the voltages applied to the first voltage source 356 and second voltage source 364 controls an electric field across the capacitor structure and pFET dielectrics and thus Fowler-Nordheim tunneling of electrons onto and off of the floating gate, thus controlling the charge on the floating gate 350 and the information value stored thereon.

High voltage switches 322 and 324 are examples of a series of high voltage switches that are arranged to provide the first and the second voltages for programming and erasing of the memory cells.

NVM controller 326 is arranged to program and address individual cells of the memory circuits to output their data by managing high voltage switches 322, 324, and the like.

Charge pump 328 is an electronic circuit that uses capacitors as energy storage elements to convert low voltages into higher voltage outputs. Charge pump circuits are typically capable of high efficiencies, sometimes as high as 90-95%.

Charge pump 328 may use switches to control a connection of voltages to the capacitor. For example, to generate a higher voltage, a first stage may involve the capacitor being connected across a voltage and charged up. In a second stage, the capacitor is disconnected from the original charging voltage and reconnected with its negative terminal to the original positive charging voltage. Because the capacitor retains the voltage across it (ignoring leakage effects) the positive terminal voltage is added to the original, effectively doubling the voltage. This higher voltage output may then be smoothed by the use of another capacitor.

The examples of FIGS. 2A, 2B, and 3A are for illustration purposes, and do not constitute a limitation on the present invention. Embodiments may be implemented in other memory circuits and other combinations of circuits for providing common support circuitry to a plurality of memory cells, without departing from the scope and spirit of the invention. For example, memory 310 may further include an oscillator, an ESD protection device, and the like.

Figure 4:
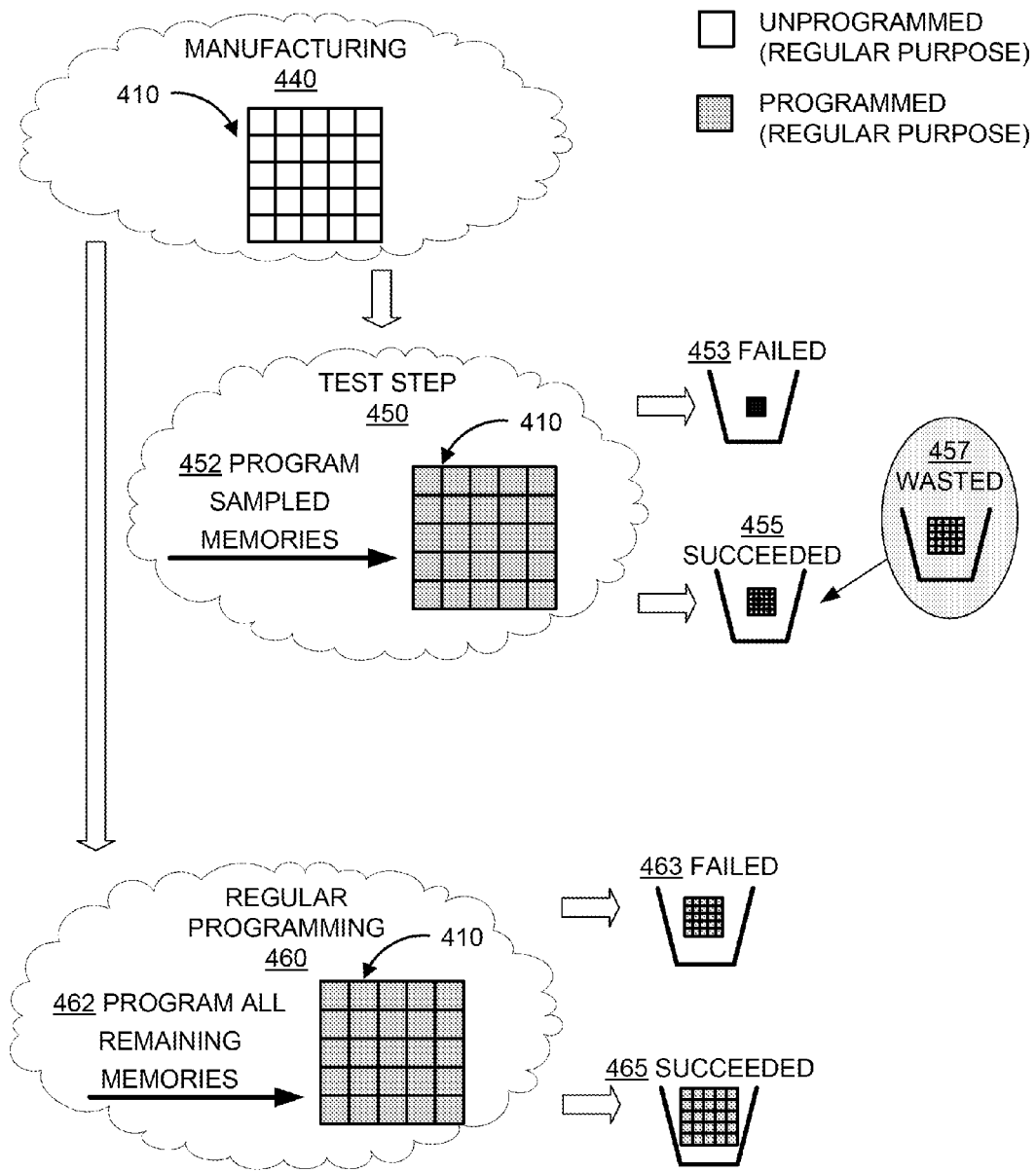
FIG. 4 is a conceptual diagram for explaining the conventional order of a process for manufacturing, testing, and regularly programming for a memory circuit such as the memory of FIG. 3A.

FIG. 4 is a conceptual diagram for explaining the conventional order of a process for manufacturing, testing, and regularly programming for a memory circuit such as the memory of FIG. 3.

An OTP memory such as the OTP memory array 410 includes a number of OTP memory cells most of which, if not all, are unprogrammed during manufacturing 440. Because the cells are OTP, a test step for confirming whether the cells are usable cannot include programming all cells. Such a test is destructive for this type of memory.

Thus, test step 450 typically includes programming (and reading) of sampled memories 452 from OTP memory array 410. As a result of the test, a group of memories may fail the test (453) and another group pass ("succeeded" 455). While the "succeeded" group included usable memory cells at the beginning of the test, after the test step 450, the memories in that group are wasted (457), because they cannot be used for other purposes any more.

In a typical manufacturing and testing environment for OTP memories, regular programming step 460 does not strictly follow the test step 450, since the testing is done on a sampling of the manufactured memories and provides only an indication of how many memories may ultimately fail, but not which ones.

Hence, when all remaining memories are regularly programmed, a portion still fails (463) and another portion succeeds (465). The manufacturing loss includes not only the failed memories as a result of regular programming, but also all of the sampled memories used for testing.

Figure 5A:
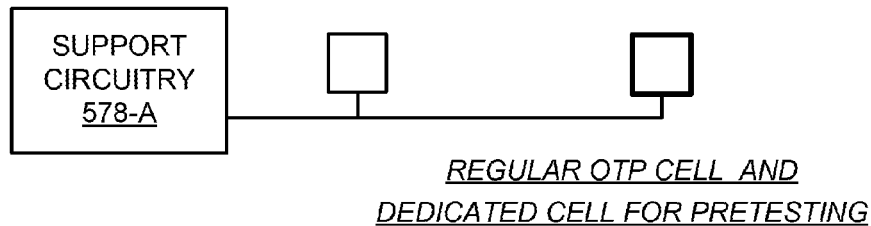
FIG. 5A is a detail for showing how a regular cell of an OTP memory can be controlled by a support circuit, as is a dedicated memory cell, whose purpose is to pretest the support circuitry according to embodiments.

FIG. 5A is a detail for showing how a regular cell of an OTP memory can be controlled by a support circuit, as is a dedicated memory cell, whose purpose is to pretest the support circuitry according to embodiments.

As discussed before, support circuitry 578-A supports both the regular OTP memory cell and the dedicated memory cell. Support circuitry 578-A may include, but is not limited to, a High Voltage (HV) switch, a charge pump, a controller, a select switch, a voltage regulator, a current source, a sense amplifier, a High Voltage (HV) driver, a bias block, and an Error Correction Circuit (ECC).

Figure 5B:
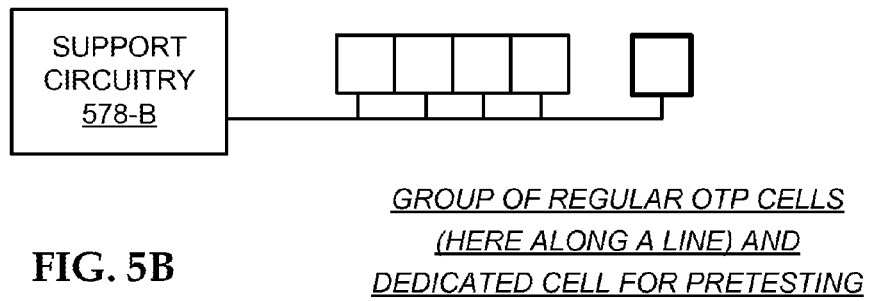
FIG. 5B is a detail for showing how a group of regular cells of an OTP memory, such as the cell of FIG. 5A, here disposed along a line, for example, are controlled by a support circuit, as is a dedicated memory cell whose purpose is to pretest the support circuitry according to embodiments.

FIG. 5B is a detail for showing how a group of regular cells of an OTP memory, such as the cell of FIG. 5A, here disposed along a line, for example, are controlled by a support circuit, as is a dedicated memory cell whose purpose is to pretest the support circuitry according to embodiments.

Memory devices typically include a plurality of memory cells, which may be configured in rows, columns, or arrays of rows and columns. In such cases, each group of regular OTP memory cells may be associated with one or more dedicated memory cell for testing the support circuitry.

In FIG. 5B, the regular OTP memory cells are configured as a row of memory cells with the last cell being the dedicated memory cell for testing the support circuitry.

Support circuitry 578-B is configured to support all of the regular OTP memory cells in the row as well as the dedicated memory cell. In addition to the above listed examples, support circuitry 578-B may also be a row driver.

Figure 5C:
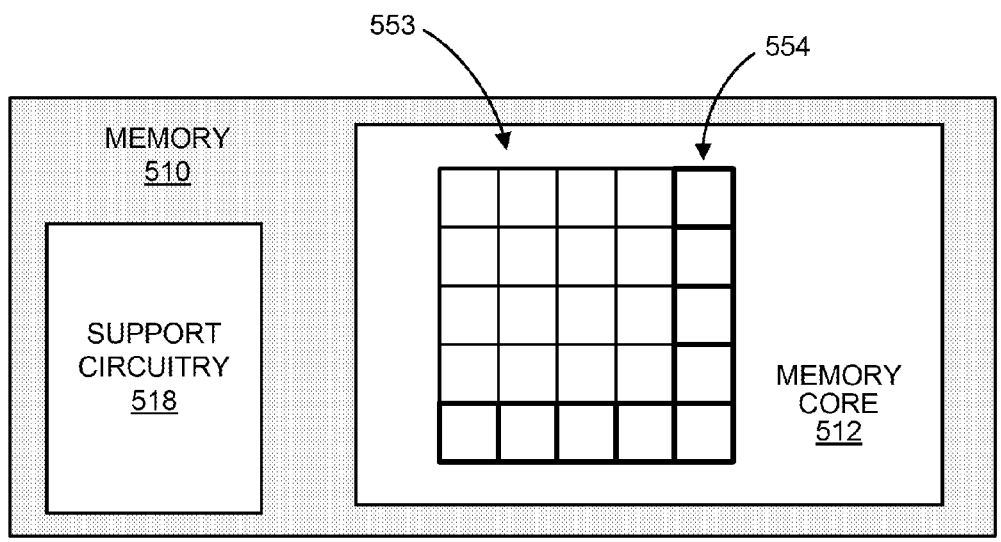
FIG. 5C is a block diagram of an initially manufactured OTP memory according to embodiments, having regular only one time programmable cells, associated support circuitry for controlling the regular cells, and dedicated memory cells for pretesting the support circuitry.

FIG. 5C is a block diagram of an initially manufactured OTP memory according to embodiments, having regular only one time programmable (OTP) cells, associated support circuitry for controlling the regular (OTP) cells, and dedicated memory cells for pretesting the support circuitry.

Memory 510 of FIG. 5C includes a memory core 512 with an array of regular OTP memory cells 553. The array also includes an extra row and an extra column of dedicated memory cells 554.

Thus, the extra row and column of dedicated memory cells may be utilized in pretesting portions of the support circuitry 518 such as row drivers (each dedicated memory cell in the extra column), column multiplexers (each dedicated memory cell in the extra row), and the like.

Figure 5D:
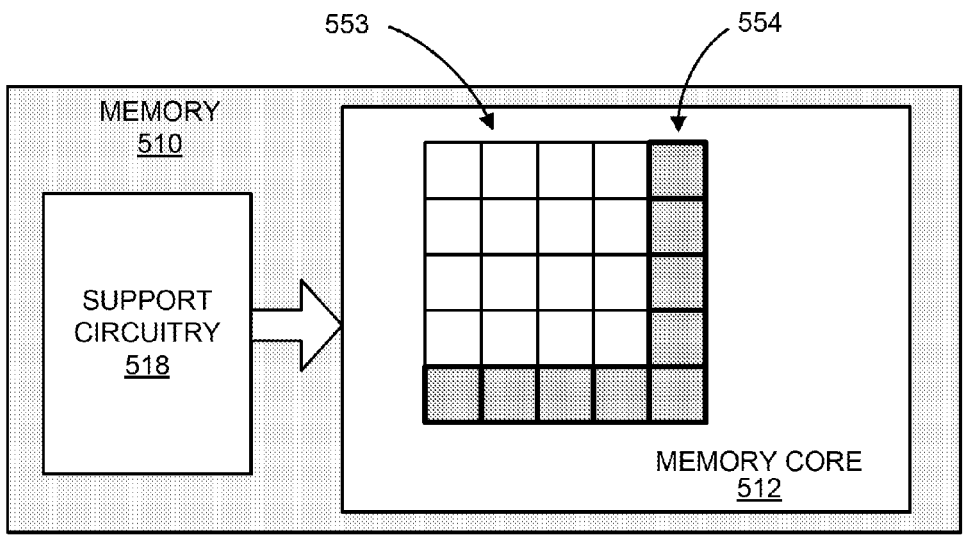
FIG. 5D is the block diagram of FIG. 5C, after the support circuitry has been pretested by the dedicated memory cells.

FIG. 5D is the block diagram of FIG. 5C, after the support circuitry has been pretested by the dedicated memory cells.

Memory 510 of FIG. 5D illustrates the memory core after the pretesting process. During the testing of the support circuitry 518, the dedicated memory cells in the extra column and row are programmed. If the dedicated memory cells are also OTP memory, they may not be used again. If they are MTP, they be reprogrammed for other purposes.

On the other hand, the regular OTP cells are not programmed during the pretest. Thus, the cells are still available for use despite the fact that 100% of the memories may have been tested.

Figure 5E:
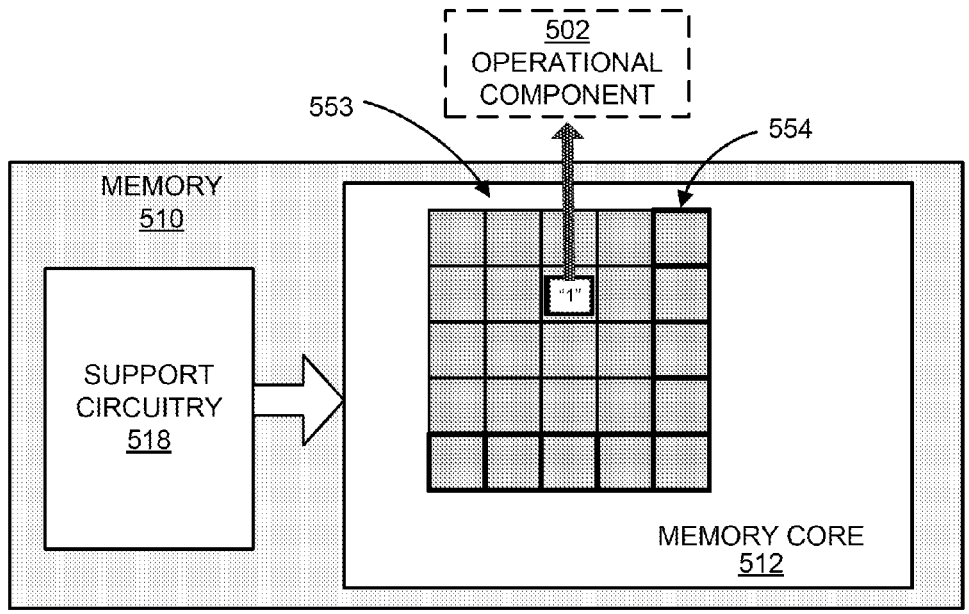
FIG. 5E is the block diagram of FIG. 5D, after the regular only one time programmable cells have been further regularly programmed for supporting an operational component.

FIG. 5E is the block diagram of FIG. 5D, after the regular only one time programmable cells have been further regularly programmed for supporting an operational component.

Memory 510 of FIG. 5E illustrates the memory core after the regular programming. Following the pretest, the memories that fail the test may be discarded. The memories that pass ("Usable") the test are programmed for their regular purpose (shaded cells) and they can be used for providing data to operational component 502 as discussed in conjunction with earlier figures.

The invention also includes methods. Some are methods of determining whether portions of a memory are usable without programming the portions intended to store the information. Others are methods for pretesting support circuitry for a memory device in a memory manufacturing and testing system.

These methods can be implemented in any number of ways, including the structures described in this document. One such way is by machine operations, of devices of the type described in this document.

Another optional way is for one or more of the individual operations of the methods to be performed in conjunction with one or more human operators performing some. These human operators need not be collocated with each other, but each can be only with a machine that performs a portion of the program.

The invention additionally includes programs, and methods of operation of the programs. A program is generally defined as a group of steps or operations leading to a desired result, due to the nature of the elements in the steps and their sequence. A program is usually advantageously implemented as a sequence of steps or operations for a processor, such as the structures described above.

Performing the steps, instructions, or operations of a program requires manipulation of physical quantities. Usually, though not necessarily, these quantities may be transferred, combined, compared, and otherwise manipulated or processed according to the steps or instructions, and they may also be stored in a computer-readable medium. These quantities include, for example, electrical, magnetic, and electromagnetic charges or particles, states of matter, and in the more general case can include the states of any physical devices or elements. It is convenient at times, principally for reasons of common usage, to refer to information represented by the states of these quantities as bits, data bits, samples, values, symbols, characters, terms, numbers, or the like. It should be borne in mind, however, that all of these and similar terms are associated with the appropriate physical quantities, and that these terms are merely convenient labels applied to these physical quantities, individually or in groups.

The invention furthermore includes storage media. Such media, individually or in combination with others, have stored thereon instructions of a program made to execute the methods according to the invention. A storage medium according to the invention is a computer-readable medium, such as a memory, and is read by a processor of the type mentioned above. If a memory, it can be implemented in a number of ways, such as Read Only Memory (ROM), Random Access Memory (RAM), and the like, some of which are volatile and some non-volatile.

Even though it is said that the program may be stored in a computer-readable medium, it should be clear to a person skilled in the art that it need not be a single memory, or even a single machine. Various portions, modules or features of it may reside in separate memories, or even separate machines. The separate machines may be connected directly, or through a network such as a local access network (LAN) or a global network such as the Internet.

Often, for the sake of convenience only, it is desirable to implement and describe a program as software. The software can be unitary, or thought in terms of various interconnected distinct software modules.

This detailed description is presented largely in terms of flowcharts, algorithms, and symbolic representations of operations on data bits on and/or within at least one medium that allows computational operations, such as a computer with memory. Indeed, such descriptions and representations are the type of convenient labels used by those skilled in programming and/or the data processing arts to effectively convey the substance of their work to others skilled in the art. A person skilled in the art of programming may use these descriptions to readily generate specific instructions for implementing a program according to the present invention.

Embodiments of support circuit pretesting system can be implemented as a combination of hardware and software. It is advantageous to consider such a system as subdivided into components or modules. A person skilled in the art will recognize that some of these components or modules can be implemented as hardware, some as software, some as firmware, and some as a combination.

Methods are now described more particularly according to embodiments.

Figure 6A:
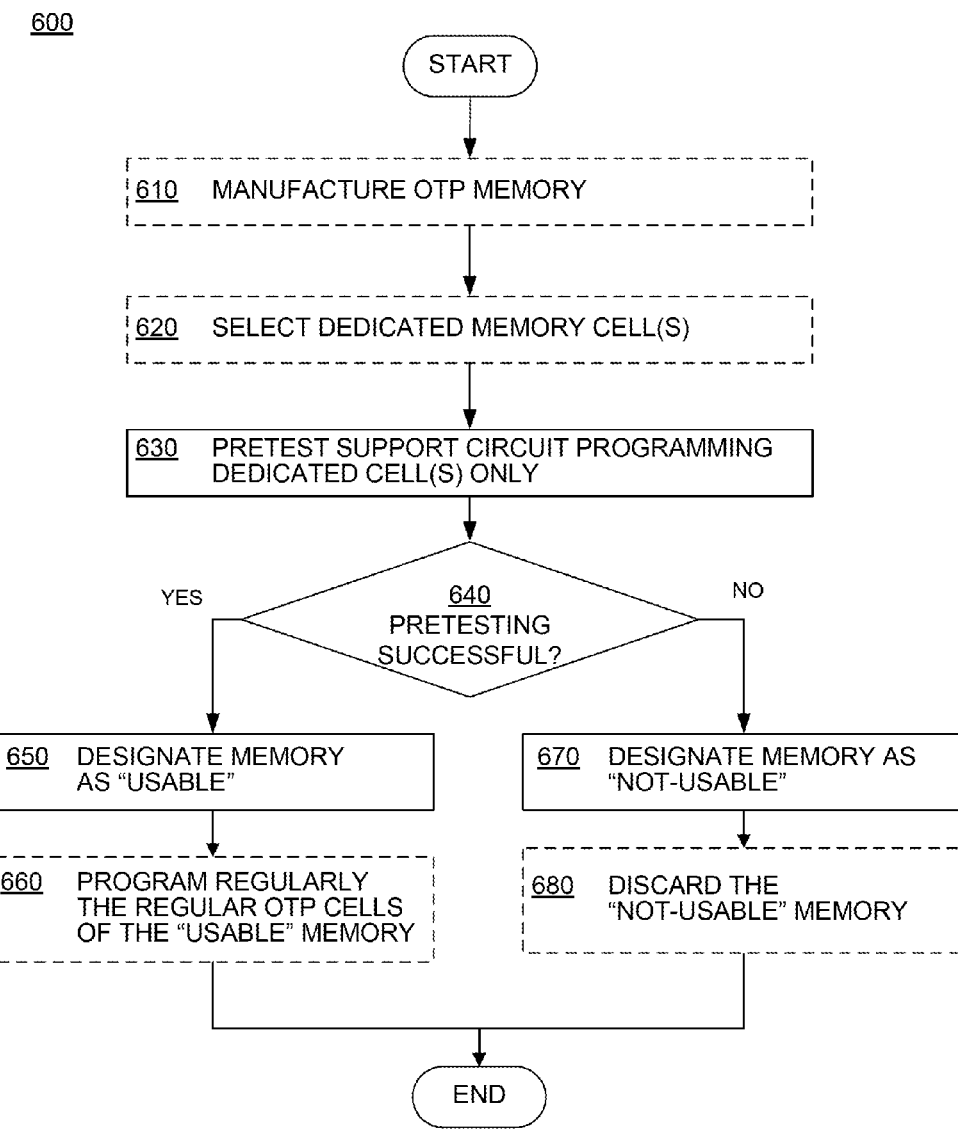
FIG. 6A is a flowchart for describing memory pretesting and programming processes according to embodiments.

FIG. 6A is a flowchart for describing memory pretesting and programming processes according to embodiments.

Process 600 begins at optional operation 610, where an OTP memory is manufactured. Manufacturing process is typically associated with testing of the manufactured memory to some degree.

According to a next optional operation 620, dedicated memory cells within the manufactured memory are selected. The selection and subsequent testing utilizing these cells may be performed by a test device providing instructions to the manufactured memory or by a test program stored within the device enabling the memory to perform a self-test routine.

According to a next operation 630, the support circuit is pretested by programming the dedicated memory cells only and not the regular memory cells. This way, OTP memories with good cells are not wasted during the test process.

According to a next decision operation 640, a determination is made whether the pretesting was successful. If the pretest was indeed successful, the tested memory is designated as "Usable" in the next operation 650.

According to a next optional operation 660, the regular OTP cells of the "Usable" memory are programmed according to manufacturing specifications.

If the determination at decision operation 640 is that the pretest was not successful, the tested memory is designated as "Not-Usable" memory in the next operation 670.

According to a next optional operation 680, the "Not-Usable" designated memories may be discarded.

Figure 6B:
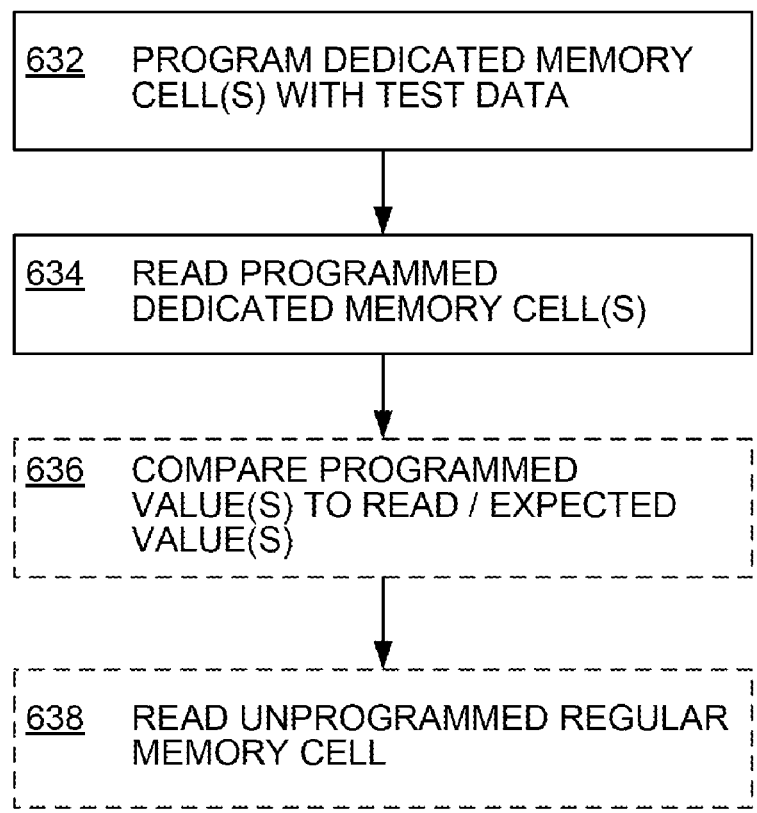
FIG. 6B is a flowchart for describing a pretesting operation of FIG. 6A according to embodiments.

FIG. 6B is a flowchart for describing a pretesting operation of FIG. 6A according to embodiments.

The pretesting operation 630 of FIG. 6A may include several sub-operations and begin with operation 632, where the dedicated memory cells are programmed with test data. Test data may include a predefined pattern, a single bit value, and the like.

According to a next operation 634, the programmed dedicated memory cells are read. In some embodiments, the fact that the programmed dedicated memory cells can be read alone may be an indication of successful pretesting of a portion of the support circuitry and the actual read value(s) may not matter.

According to a next optional operation 636, the programmed value(s) of the dedicated memory cells is compared to the read value(s) or expected value(s). The comparison is then used to determine whether the pretest was successful or not.

According to a next optional operation, the unprogrammed regular OTP cells may also be read. Since they are known not to have been programmed, the regular OTP cells should not provide a programmed value in a read operation. If they do, the memory may be designated as "Not-Usable". In practical implementations, this may indicate a short in the support lines which results in the regular cells also being programmed when the dedicated cells are programmed.

The operations included in processes 600 and 630 are for illustration purposes. Pretesting support circuitry using dedicated memory cells may be implemented by similar processes with fewer or additional steps, as well as in different order of operations using the principles described herein.

Figure 7:
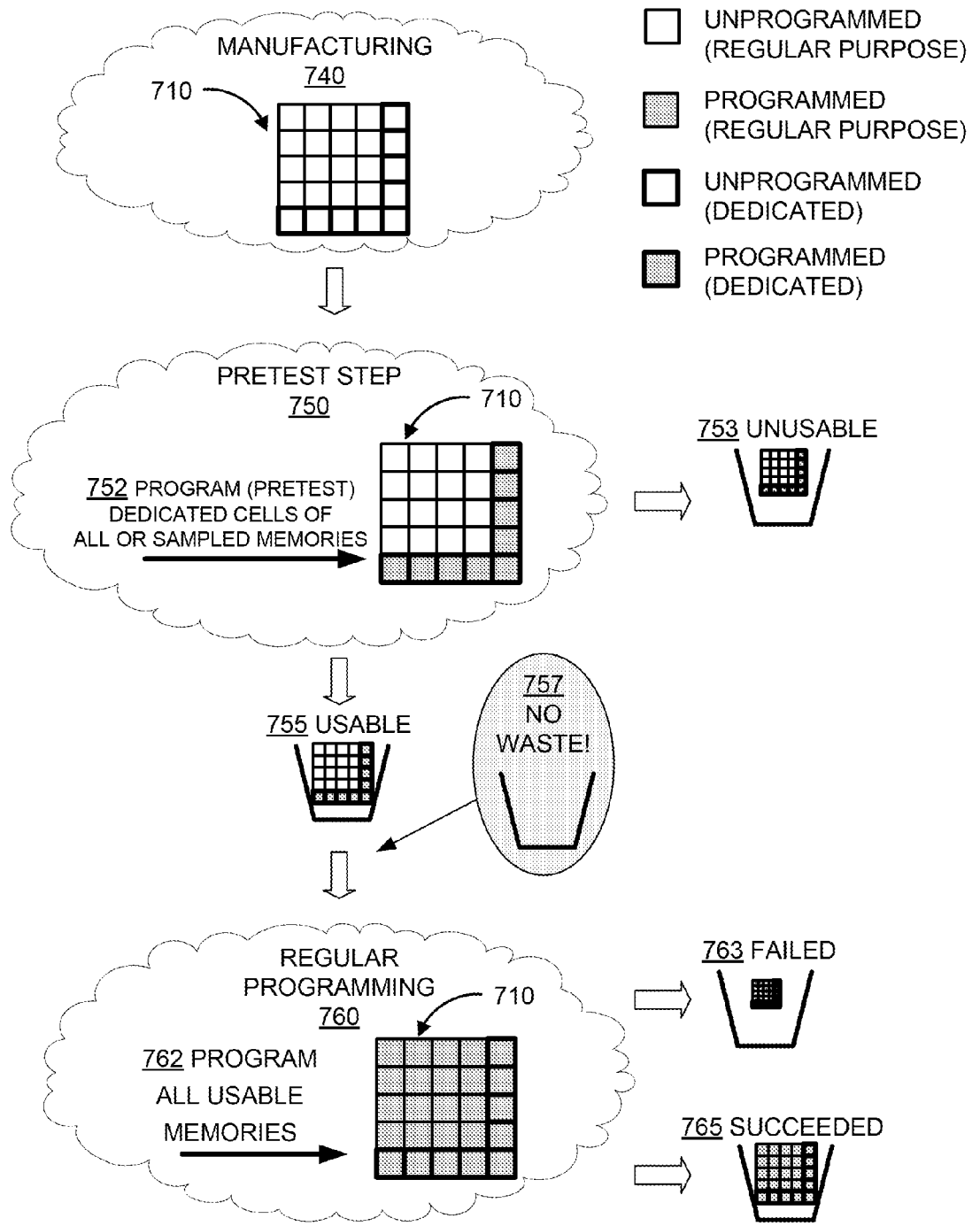
FIG. 7 is a conceptual diagram for showing situations arising from following the process of FIG. 6A.

FIG. 7 is a conceptual diagram for showing situations arising from following the process of FIG. 6A.

An example memory 710 during manufacturing 740 includes regular unprogrammed OTP memory cells and dedicated unprogrammed memory cells associated with groups of the regular OTP memory cells.

During the pretest step 750, the dedicated memory cells of all or a sampled group of memories are programmed (752). As a result of the pretest step 750, a portion of the memories may fail the test and designated "Unusable" (753).

Subsequently, any untested memories and the "Usable" memories (755) that successfully pass the pretest are regularly programmed during the regular programming step 760. Thus, no memories are wasted in testing (757).

During the regular programming the regular OTP memory cells of all memories are programmed (762). Still, a portion of the memories may fail the regular programming (763) and be discarded, but their percentage is likely to be smaller due to the pretest step resulting in an increase in the successfully programmed memories 765 and no wasted memories in pretesting.

FIGS. 8A-8E illustrate different dedicated test element configurations in which multiple regular cells and multiple dedicated cells can be arranged in an OTP memory array.

Figure 8A:
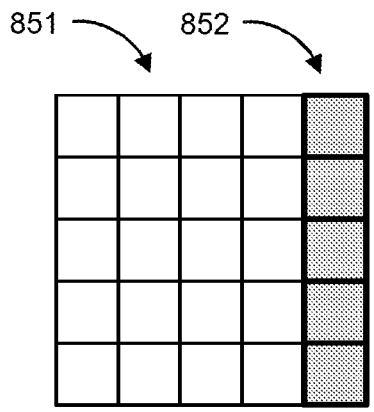
FIGS. 8A-8E illustrate different dedicated test element configurations in which multiple regular cells and multiple dedicated cells can be arranged in an OTP memory array.

In FIG. 8A, for each row of regular OTP memory cells 851 there is a dedicated memory test cell in column 852 for pretesting the support circuitry of each row.

Figure 8B:
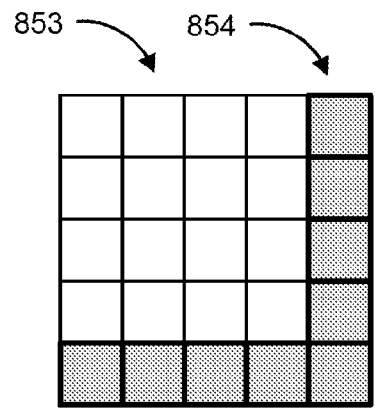

In FIG. 8B, for each row and column of regular OTP memory cells 853 there are dedicated memory test cells in column 854 and the last row of the array. Thus, the support circuitry of each row of regular memory cells may be pretested using the dedicated memory test cells of the last column and the support circuitry of each column of regular memory cells may be pretested using the dedicated memory test cells of the last row.

Figure 8C:
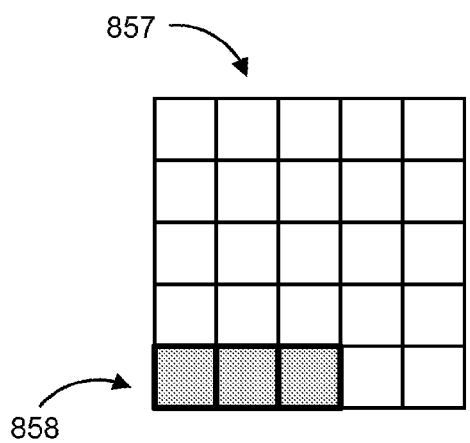
Figure 8D:
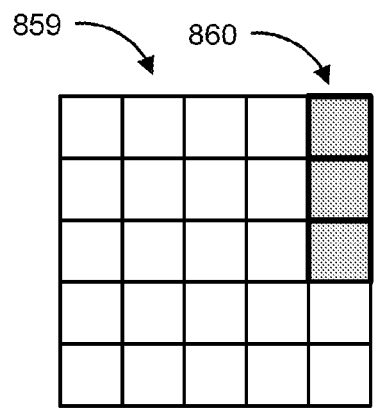

FIG. 8C and FIG. 8D are examples of partial pretesting. In FIG. 8C, dedicated memory test cells 858 are present for testing the support circuitry for only a portion of columns of regular memory cells 857. Similarly, in FIG. 8D, only the support circuitry for a portion of regular memory cell rows 859 may be tested by the dedicated memory test cells 860 in the last column.

Figure 8E:
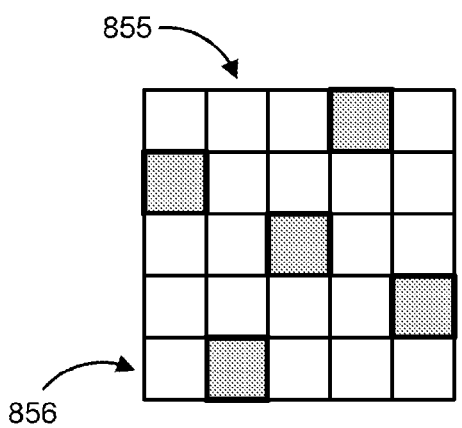

Finally, FIG. 8E illustrates that using dedicated memory test cells 856 for pretesting support circuitry is not limited to row or column formats of the dedicated cells. Indeed, the dedicated memory test cells may be selected in any order including random order throughout the memory cell array 855.

Figure 9:
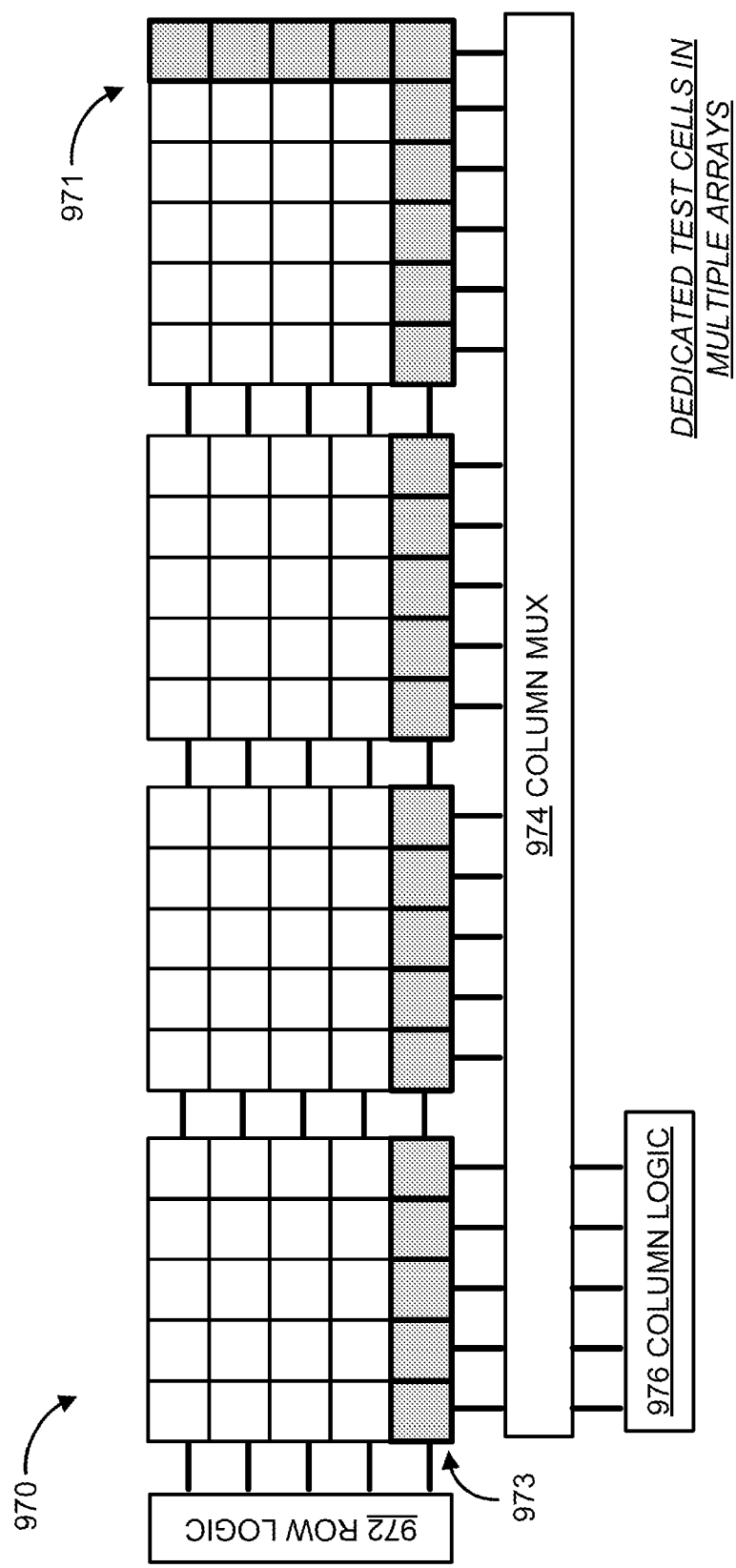
FIG. 9 illustrates dedicated test elements in a multiple array OTP memory configuration.

FIG. 9 illustrates dedicated test elements in a multiple array OTP memory configuration.

The multi-array memory device 970 of FIG. 9 includes row logic 972 for providing support operations for the arrays and column logic 976 for providing support operations for the columns of the arrays. The column logic may be multiplexed using column multiplexer 974.

According to some embodiments, each of the arrays may include a row (an extra row) of dedicated memory test cells for pretesting the column logic 976, while the row logic 972 shared by all arrays may be pretested by a single extra column of dedicated memory test cells (971) in the last array.

Other configurations of multi-array memory devices in light of the different configurations shown in FIGS. 8A-8E may also be implemented according to embodiments.

In this description, numerous details have been set forth in order to provide a thorough understanding. In other instances, well-known features have not been described in detail in order to not obscure unnecessarily the description.

A person skilled in the art will be able to practice the embodiments in view of this description, which is to be taken as a whole. The specific embodiments as disclosed and illustrated herein are not to be considered in a limiting sense. Indeed, it should be readily apparent to those skilled in the art that what is described herein may be modified in numerous ways. Such ways can include equivalents to what is described herein.

The following claims define certain combinations and sub-combinations of elements, features, steps, and/or functions, which are regarded as novel and non-obvious. Additional claims for other combinations and sub-combinations may be presented in this or a related document.

What is claimed is:

1. A programmable memory device, comprising:
   support circuitry; and
   a memory array connected to the support circuitry, the memory array comprising:
      a plurality of one time programmable (OTP) memory cells operable to store data under control of the support circuitry; and
      at least one multiple time programmable (MTP) memory cell operable to store data and to test operations of the support circuitry associated with a subset of the plurality of the OTP memory cells.

2. The device of claim 1, in which
   the at least one MTP memory cell is configured to be programmed with a test value and then to be read, for testing the support circuitry.

3. The device of claim 2, in which
the read test value and the programmed test value are compared for testing the support circuitry.

4. The device of claim 2, in which
the read test value is compared to an expected value for testing the support circuitry.

5. The device of claim 4, in which
the read test value and the expected test value include an analog range of values.

6. The device of claim 2, in which
the support circuitry includes a column multiplexer configured to read out test values.

7. The device of claim 1, in which
the support circuitry includes a High Voltage (HV) switch configured to provide a first voltage level for programming the OTP memory cells and the MTP memory cells, and a second voltage for erasing the MTP memory cells.

8. The device of claim 7, in which
the support circuitry includes a High Voltage (HV) driver configured to operate the high voltage switch.

9. The device of claim 1, in which
the support circuitry includes a charge pump configured to generate voltage levels to program the OTP memory cells within the memory array.

10. The device of claim 1, in which
the support circuitry includes a controller configured to program and address the memory array.

11. The device of claim 1, in which
the support circuitry includes a sense amplifier.

12. The device of claim 1, in which
the support circuitry includes a plurality of row drivers, each row driver configured to apply a voltage to a row of cells in the memory array.

13. The device of claim 1, further comprising
a line of the MTP memory cells wherein each MTP memory cell shares a row or a column with at least one of the plurality of OTP memory cells.

14. The device of claim 13, in which
the line is a row.

15. The device of claim 13, in which
the line is a column.

16. The device of claim 1 further comprising a second memory array controlled by the support circuitry, wherein operations associated with the support circuitry for the second array are tested using the MTP memory cells in the other array.

17. The device of claim 1, in which
the at least one MTP memory cell is programmed and read one at a time.

18. The device of claim 1, in which
a plurality of MTP memory cells are programmed concurrently.

19. The device of claim 1, in which
a plurality of MTP memory cells are read concurrently.

20. The device of claim 1, in which
a plurality of MTP memory cells are programmed and read one bit at a time.

21. The device of claim 1, in which
a plurality of MTP memory cells are programmed and read multiple bits at a time.

22. The device of claim 1, in which each MTP memory cell is placed randomly in the memory array.

23. The device of claim 22, in which each MTP memory cell is placed on a different row and a different column of the memory array.

24. The device of claim 1, in which:
each OTP memory cell and MTP memory cell comprises a floating gate pFET readout transistor, the readout transistor having a source coupled to a power source and a drain providing a drain current for determining a state of each of the OTP memory cells.

25. A method, comprising:
testing support circuitry for operations associated with controlling at least one multiple time programmable (MTP) memory cell in a memory array, wherein testing includes programming the at least one MTP memory cell;
determining a plurality of one-time programmable (OTP) memory cells in the memory array sharing a same row or column with the at least one MTP memory cell in the memory array as usable; and
reprogramming the at least one MTP memory cell for storing data with the OTP memory cells responsive to determining the memory array as usable.

26. The method of claim 25, wherein testing the support circuitry further comprises:
programming the at least one MPT memory cell with a test value;
reading a value from the at least one programmed MTP memory cell; and
comparing the read value with the test value to determine if the programming was successful.

27. The method of claim 26, in which the read value is defined as an analog range of values.

28. The method of claim 26, further comprising:
programming and reading the MTP memory cells one at a time.

29. The method of claim 26, further comprising:
programming the MTP memory cells concurrently.

30. The method of claim 26, further comprising:
reading the MTP memory cells concurrently.

31. The method of claim 26, further comprising:
programming and reading the MTP memory cells one bit at a time.

32. The method of claim 26, further comprising:
programming and reading the MTP memory cells multiple bits at a time.

33. The method of claim 25, further comprising:
programming the memory array responsive to determining the support circuitry as usable, and reprogramming the at least one MTP cell used for testing the support circuitry.

34. The method of claim 25, in which
testing the support circuitry utilizes a plurality of MTP memory cells, and reprogramming the plurality of MTP memory cells.

35. The method of claim 34, in which
the support circuitry is configured to support a column and a row of memory cells.

36. The method of claim 35, in which
the support circuitry includes a plurality of row driver, each row driver configured to apply a voltage to a row of cells in the memory array.

37. The method of claim 35, in which
the support circuitry includes a plurality of column multiplexer, each multiplexer configured to read out test values.

38. The method of claim 34, in which
a subset of the OTP memory cells and a subset of the MTP memory cells are arranged along a line.

39. The method of claim 38, in which
the line is a row.

40. The method of claim 38, in which
the line is a column.

41. The method of claim 25, the method further comprising:
placing each MTP memory cell on a different row and a different column within the memory array.

42. An article comprising a machine-readable non-transitory memory containing thereon instructions which, if executed by mask making machinery as instructions for processing a semiconductor wafer, an integrated circuit will result on the wafer, the integrated circuit suitable for being separated from the wafer to form a memory device, the memory device comprising:
at least one memory array comprising:
a plurality of one time programmable (OTP) memory cells, operable to store data;
and a plurality of multiple time programmable (MTP) memory cells, each operable to store data and associated with at least one of the plurality of OTP memory cells; and
support circuitry operable to control the plurality of OTP memory cells and the plurality of MTP memory test cells, in which at least a portion of the support circuitry can be pretested utilizing the plurality of MTP memory test cells.

43. The article of claim 42, in which
the plurality of MTP memory cells are configured to be programmed with a test value and then to be read, for testing the support circuitry.

44. The article of claim 43, in which
the read test value and the programmed test value are compared for testing the support circuitry.

45. The article of claim 43, in which
the read test value is compared to an expected value for testing the support circuitry.

46. The article of claim 45, in which
the read test value and the expected test value include an analog range of values.

47. The article of claim 42, in which each MTP memory cell is placed randomly in the memory array.

48. The article of claim 42, in which each MTP memory cell is placed on a different row and a different column of the memory array.

49. The article of claim 42, in which:
each OTP memory cell and MTP memory cell comprises a floating gate pFET readout transistor, the readout transistor having a source coupled to a power source and a drain providing a drain current for determining a state of each of the OTP memory cells.

* * * * *